United States Patent
Fellows et al.

(10) Patent No.: US 8,860,051 B2
(45) Date of Patent: Oct. 14, 2014

(54) TEXTURED PHOSPHOR CONVERSION LAYER LIGHT EMITTING DIODE

(75) Inventors: Natalie N. Fellows, Santa Barbara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 355 days.

(21) Appl. No.: 11/940,885

(22) Filed: Nov. 15, 2007

(65) Prior Publication Data
US 2008/0128730 A1    Jun. 5, 2008

Related U.S. Application Data

(60) Provisional application No. 60/866,024, filed on Nov. 15, 2006.

(51) Int. Cl.
*H01L 33/22* (2010.01)
*H01L 33/58* (2010.01)
*H01L 33/50* (2010.01)
*H01L 33/44* (2010.01)

(52) U.S. Cl.
CPC ............ *H01L 33/508* (2013.01); *H01L 33/58* (2013.01); *H01L 2933/0091* (2013.01); *H01L 33/507* (2013.01); *H01L 33/22* (2013.01); *H01L 33/44* (2013.01)
USPC ................................ 257/98; 257/99; 257/103

(58) Field of Classification Search
USPC ....................... 257/98–103, E33.061
See application file for complete search history.

(56) References Cited

U.S. PATENT DOCUMENTS

| | | | |
|---|---|---|---|
| 3,607,463 A | 9/1971 | Kinoshita et al. |
| 3,999,280 A | 12/1976 | Hansen et al. |
| 4,026,692 A | 5/1977 | Bartholomew |
| 4,497,974 A | 2/1985 | Deckman et al. |
| 5,416,870 A | 5/1995 | Chun et al. |
| 5,696,389 A | 12/1997 | Ishikawa et al. |
| 5,775,792 A | 7/1998 | Wiese |
| 5,780,867 A | 7/1998 | Fritz et al. |
| 5,932,048 A | 8/1999 | Furukawa et al. |
| 6,155,699 A | 12/2000 | Miller et al. |
| 6,357,889 B1 | 3/2002 | Duggal et al. |

(Continued)

FOREIGN PATENT DOCUMENTS

| DE | 19807758 | 12/1998 |
|---|---|---|
| EP | 1081771 A2 | 3/2001 |

(Continued)

OTHER PUBLICATIONS

Fujii, T. et al., "Increase in the extraction efficiency of GaN-based light-emitting diodes via surface roughening," Appl. Phys. Lett., Feb. 9, 2004, pp. 855-857, vol. 84, No. 6.

(Continued)

*Primary Examiner* — Tran Tran
(74) *Attorney, Agent, or Firm* — Gates & Cooper LLP

(57) ABSTRACT

This invention is related to LED Light Extraction for optoelectronic applications. More particularly the invention relates to (Al, Ga, In)N combined with optimized optics and phosphor layer for highly efficient (Al, Ga, In)N based light emitting diodes applications, and its fabrication method. A further extension is the general combination of a shaped high refractive index light extraction material combined with a shaped optical element.

16 Claims, 10 Drawing Sheets

(56) References Cited

U.S. PATENT DOCUMENTS

| | | |
|---|---|---|
| 6,373,188 B1 | 4/2002 | Johnson et al. |
| 6,417,019 B1 | 7/2002 | Mueller et al. |
| 6,452,217 B1 | 9/2002 | Wojnarkowski et al. |
| 6,515,308 B1 | 2/2003 | Kneissl et al. |
| 6,547,423 B2 | 4/2003 | Marshall et al. |
| 6,548,956 B2 | 4/2003 | Forrest et al. |
| 6,569,544 B1 | 5/2003 | Alian et al. |
| 6,573,530 B1 | 6/2003 | Sargent et al. |
| 6,573,537 B1 | 6/2003 | Steigerwald et al. |
| 6,607,286 B2 | 8/2003 | West et al. |
| 6,674,096 B2 | 1/2004 | Sommers |
| 6,686,218 B2 | 2/2004 | Lin et al. |
| 6,717,362 B1 | 4/2004 | Lee et al. |
| 6,729,746 B2 | 5/2004 | Suehiro et al. |
| 6,746,295 B2 | 6/2004 | Sorg |
| 6,784,460 B2 | 8/2004 | Ng et al. |
| 6,961,190 B1 | 11/2005 | Tamaoki et al. |
| 6,997,580 B2 | 2/2006 | Wong |
| 6,998,281 B2 | 2/2006 | Taskar et al. |
| 7,053,419 B1 | 5/2006 | Camras et al. |
| 7,098,589 B2 | 8/2006 | Erchak et al. |
| 7,119,271 B2 | 10/2006 | King et al. |
| 7,126,159 B2 | 10/2006 | Itai et al. |
| 7,135,709 B1 | 11/2006 | Wirth et al. |
| 7,157,745 B2 * | 1/2007 | Blonder et al. ............... 257/98 |
| 7,223,998 B2 | 5/2007 | Schwach et al. |
| 7,250,728 B2 | 7/2007 | Chen et al. |
| 7,253,447 B2 | 8/2007 | Oishi et al. |
| 7,268,371 B2 | 9/2007 | Krames et al. |
| 7,291,864 B2 | 11/2007 | Weisbuch et al. |
| 7,329,982 B2 | 2/2008 | Conner et al. |
| 7,344,958 B2 | 3/2008 | Murai et al. |
| 7,345,298 B2 | 3/2008 | Weisbuch et al. |
| 7,358,537 B2 * | 4/2008 | Yeh et al. .................... 257/95 |
| 7,390,117 B2 | 6/2008 | Leatherdale et al. |
| 7,414,270 B2 | 8/2008 | Kim et al. |
| 7,582,910 B2 | 9/2009 | David et al. |
| 7,687,813 B2 | 3/2010 | Nakamura et al. |
| 7,704,763 B2 | 4/2010 | Fujii et al. |
| 7,719,020 B2 | 5/2010 | Murai et al. |
| 7,755,096 B2 | 7/2010 | Weisbuch et al. |
| 2001/0033135 A1 | 10/2001 | Duggal et al. |
| 2002/0085601 A1 | 7/2002 | Wang et al. |
| 2002/0123204 A1 | 9/2002 | Torvik et al. |
| 2002/0158578 A1 | 10/2002 | Eliashevich et al. |
| 2003/0215766 A1 | 11/2003 | Fischer et al. |
| 2004/0046179 A1 | 3/2004 | Johannes et al. |
| 2004/0079408 A1 | 4/2004 | Fetzer et al. |
| 2004/0089868 A1 | 5/2004 | Hon et al. |
| 2004/0094772 A1 | 5/2004 | Hon et al. |
| 2004/0211970 A1 | 10/2004 | Hayashimoto et al. |
| 2005/0029528 A1 | 2/2005 | Ishikawa |
| 2005/0032257 A1 | 2/2005 | Camras et al. |
| 2005/0035354 A1 | 2/2005 | Lin et al. |
| 2005/0062830 A1 | 3/2005 | Taki et al. |
| 2005/0077532 A1 | 4/2005 | Ota et al. |
| 2005/0082562 A1 | 4/2005 | Ou et al. |
| 2005/0093008 A1 | 5/2005 | Suehiro et al. |
| 2005/0111240 A1 | 5/2005 | Yonekubo |
| 2005/0121688 A1 | 6/2005 | Nagai et al. |
| 2005/0133810 A1 | 6/2005 | Roberts et al. |
| 2005/0156510 A1 | 7/2005 | Chua et al. |
| 2005/0184300 A1 | 8/2005 | Tazima et al. |
| 2005/0189551 A1 | 9/2005 | Peng et al. |
| 2005/0205884 A1 | 9/2005 | Kim et al. |
| 2005/0212002 A1 | 9/2005 | Sanga et al. |
| 2005/0224830 A1 | 10/2005 | Blonder et al. |
| 2005/0243570 A1 | 11/2005 | Chaves et al. |
| 2005/0248271 A1 * | 11/2005 | Ng et al. .................... 313/512 |
| 2005/0265404 A1 * | 12/2005 | Ashdown .................... 372/20 |
| 2006/0001186 A1 | 1/2006 | Murai et al. |
| 2006/0008941 A1 | 1/2006 | Haskell et al. |
| 2006/0009006 A1 | 1/2006 | Murai et al. |
| 2006/0054905 A1 | 3/2006 | Schwach et al. |
| 2006/0138439 A1 | 6/2006 | Bogner et al. |
| 2006/0145170 A1 | 7/2006 | Cho |
| 2006/0163601 A1 | 7/2006 | Harle et al. |
| 2006/0171152 A1 * | 8/2006 | Suehiro et al. ............... 362/363 |
| 2006/0175624 A1 | 8/2006 | Sharma et al. |
| 2006/0186418 A1 | 8/2006 | Edmond et al. |
| 2006/0192217 A1 | 8/2006 | David et al. |
| 2006/0194359 A1 | 8/2006 | Weisbuch et al. |
| 2006/0202219 A1 | 9/2006 | Ohashi et al. |
| 2006/0202226 A1 | 9/2006 | Weisbuch et al. |
| 2006/0234486 A1 | 10/2006 | Speck et al. |
| 2006/0237723 A1 | 10/2006 | Nagai et al. |
| 2006/0243993 A1 | 11/2006 | Yu |
| 2006/0246722 A1 | 11/2006 | Speck et al. |
| 2007/0001185 A1 | 1/2007 | Lu et al. |
| 2007/0001186 A1 | 1/2007 | Murai et al. |
| 2007/0012940 A1 * | 1/2007 | Suh et al. ................... 257/99 |
| 2007/0019409 A1 | 1/2007 | Nawashiro et al. |
| 2007/0085100 A1 | 4/2007 | Diana et al. |
| 2007/0102721 A1 | 5/2007 | DenBaars et al. |
| 2007/0120135 A1 | 5/2007 | Soules et al. |
| 2007/0125995 A1 | 6/2007 | Weisbuch et al. |
| 2007/0145397 A1 | 6/2007 | DenBaars et al. |
| 2007/0147072 A1 | 6/2007 | Scobbo et al. |
| 2007/0189013 A1 | 8/2007 | Ford |
| 2007/0252164 A1 | 11/2007 | Zhong et al. |
| 2008/0128730 A1 | 6/2008 | Fellows et al. |
| 2008/0128731 A1 | 6/2008 | DenBaars et al. |
| 2008/0135864 A1 | 6/2008 | David et al. |
| 2008/0149949 A1 | 6/2008 | Nakamura et al. |
| 2008/0182420 A1 | 7/2008 | Hu et al. |
| 2008/0191191 A1 | 8/2008 | Kim |

FOREIGN PATENT DOCUMENTS

| | | |
|---|---|---|
| EP | 1536487 | 6/2005 |
| JP | 09027642 | 1/1997 |
| JP | 10200165 | 7/1998 |
| JP | 2003016808 | 1/2003 |
| JP | 2005-191197 | 7/2005 |
| JP | 2005191514 | 7/2005 |
| JP | 2005-268323 | 9/2005 |
| JP | 2006024615 | 1/2006 |
| JP | 2006032387 | 2/2006 |
| JP | 2006191103 | 7/2006 |
| JP | 2006-237264 | 9/2006 |
| WO | 2005064666 | 7/2005 |
| WO | 2005083037 A1 | 9/2005 |

OTHER PUBLICATIONS

Jasinski, J. et al., "Microstructure of GaAs/GaN interfaces produced by direct wafer fusion," Appl. Phys. Lett., Oct. 21, 2002, pp. 3152-3154, vol. 81, No. 17.

Kish, F.A. et al., "Very high-efficiency semiconductor wafer-bonded transparent-substrate (Al$_x$G$_{z1-x}$)0.5In0.5P/GaP light-emitting diodes," Appl. Phys. Lett., May 23, 1998, pp. 2839-2841, vol. 64, No. 21.

Liau, Z.L. et al., "Wafer fusion: A novel technique for optoelectronic device fabrication and monolithic integration," Appl. Phys. Lett., Feb. 19, 1990, pp. 737-739, vol. 56, No. 8.

Murai, A. et al., "Wafer Bonding of GaN and ZnSSe for Optoelectronic Applications," Jpn. J. Appl. Phys., 2004, pp. L1275-L1277, vol. 43, No. 10A.

Narukawa, Y. et al., "Ultra-High Efficiency White Light Emitting Diodes," Jpn. J. Appl. Phys., 2006, pp. L1084-L1086, vol. 45, No. 41.

International Search Report mailed Nov. 1, 2007.

Murai, A. et al., "Hexagonal pyramid shaped light-emitting diodes based on ZnO and GaN direct wafer bonding," Applied Physics Letters, vol. 89, No. 17, Oct. 26, 2006, pp. 171116-1-171116-3.

Nakahara, K. et al., "Improved external efficiency InGaN-based light-emitting diodes with transparent conductive Ga-doped ZnO as p-electrodes," Jpn. J. or Applied Physics 2004, pp. L180-L182, vol. 43(2A).

Nakamura, S. et al., "High-brightness InGaN blue, green and yellow light-emitting diodes with quantum well structures," Jpn. J. Appl. Phys. 1995, L797-L799, vol. 34 (Part 2, 7A).

(56) References Cited

OTHER PUBLICATIONS

International Search Report dated May 23, 2008, for PCT application No. PCT/US2007/023972 filed on Nov. 15, 2007.
Extended European search report for European application No. 07862038.2 dated Jan. 6, 2012.
Japanese Office Action dated Jun. 4, 2012 for JP application No. 2009-537203.
Japanese Office Action (with English translation) dated Jun. 12, 2013 for Japanese Patent Application No. 2009-537203.
Japanese Office Action (with English translation) dated Feb. 28, 2014 for Japanese Patent Application No. 2009-537203.
Japanese Denial of Entry of Amendment (with English translation) dated Feb. 28, 2014 for Japanese Patent Application No. 2009-537203.

* cited by examiner

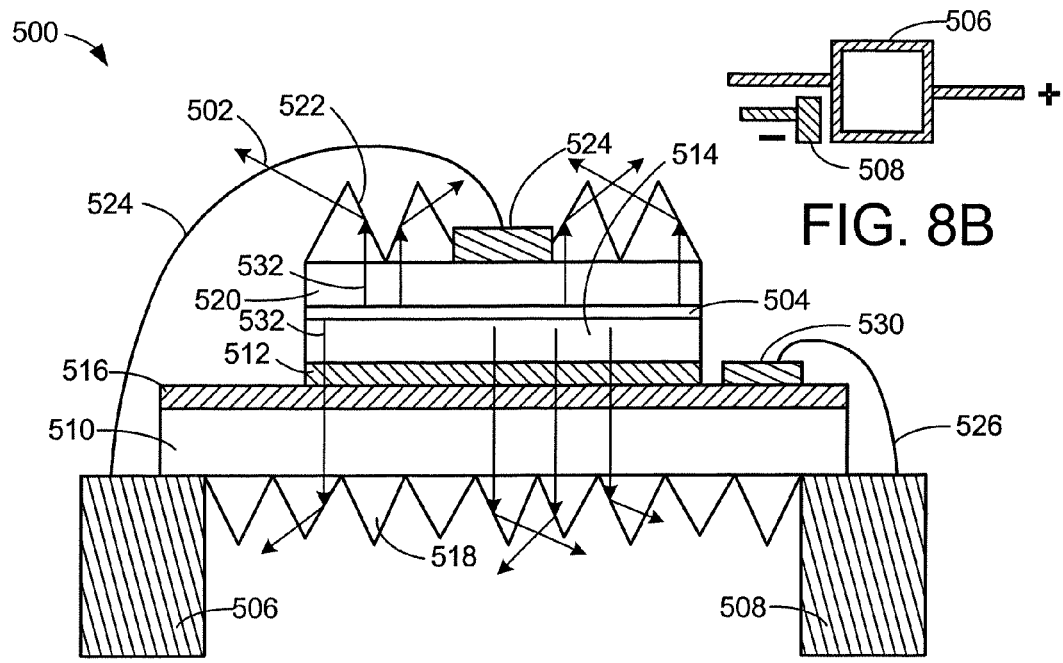
FIG. 8A
FIG. 8B
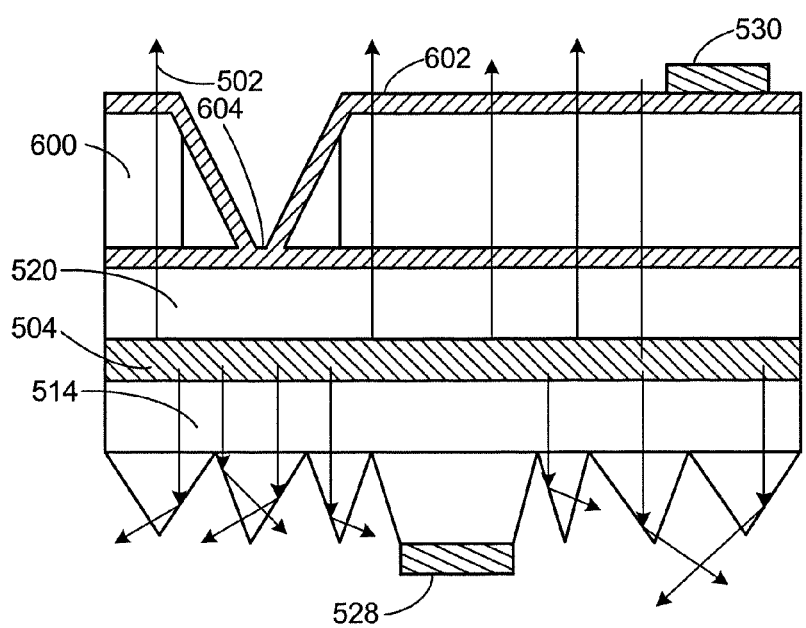
FIG. 9

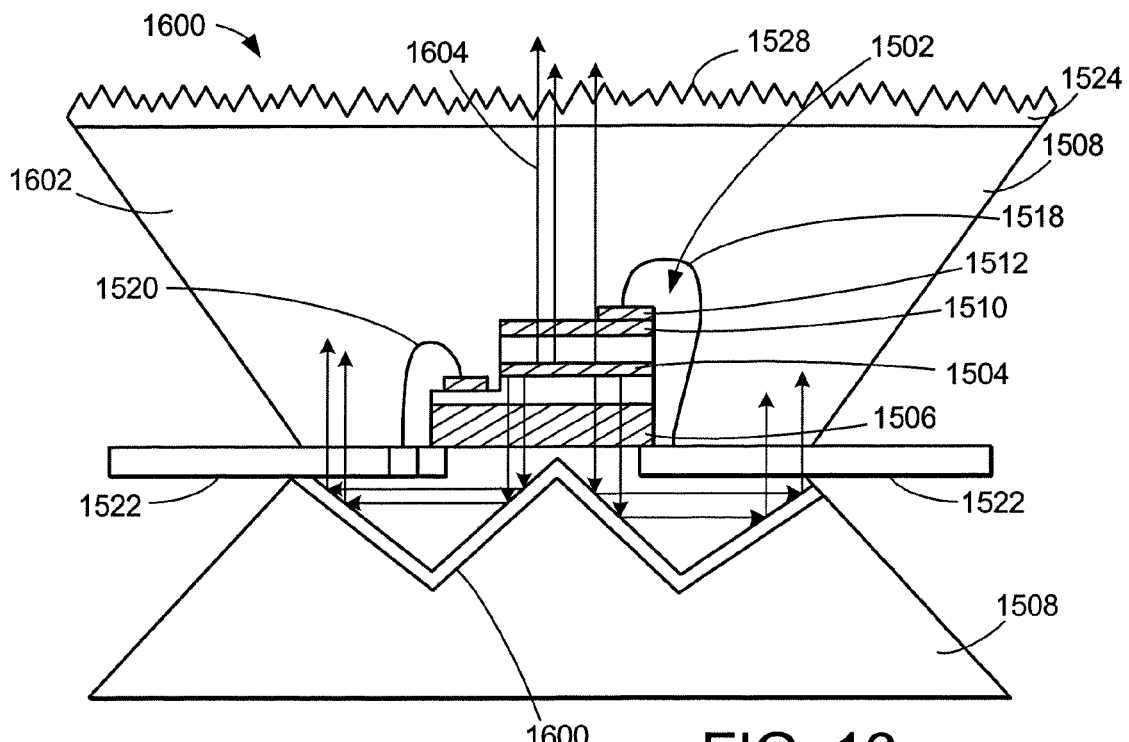
FIG. 16
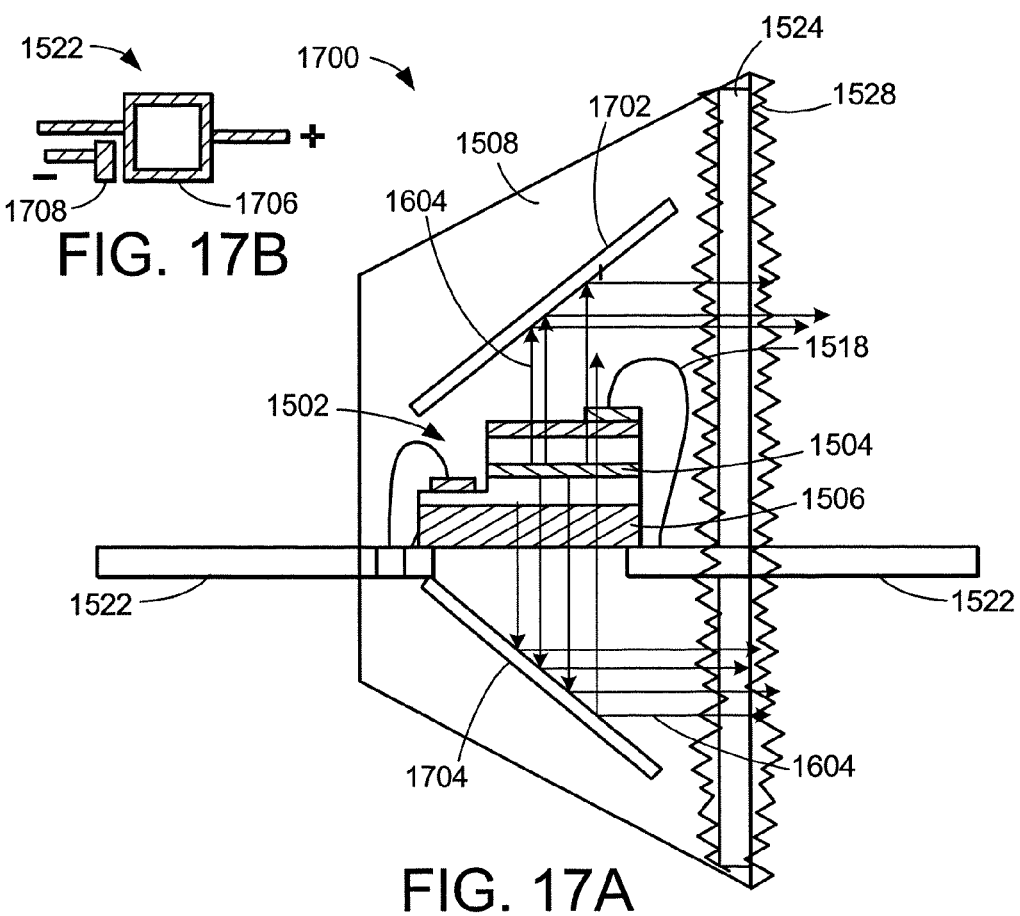
FIG. 17B
FIG. 17A

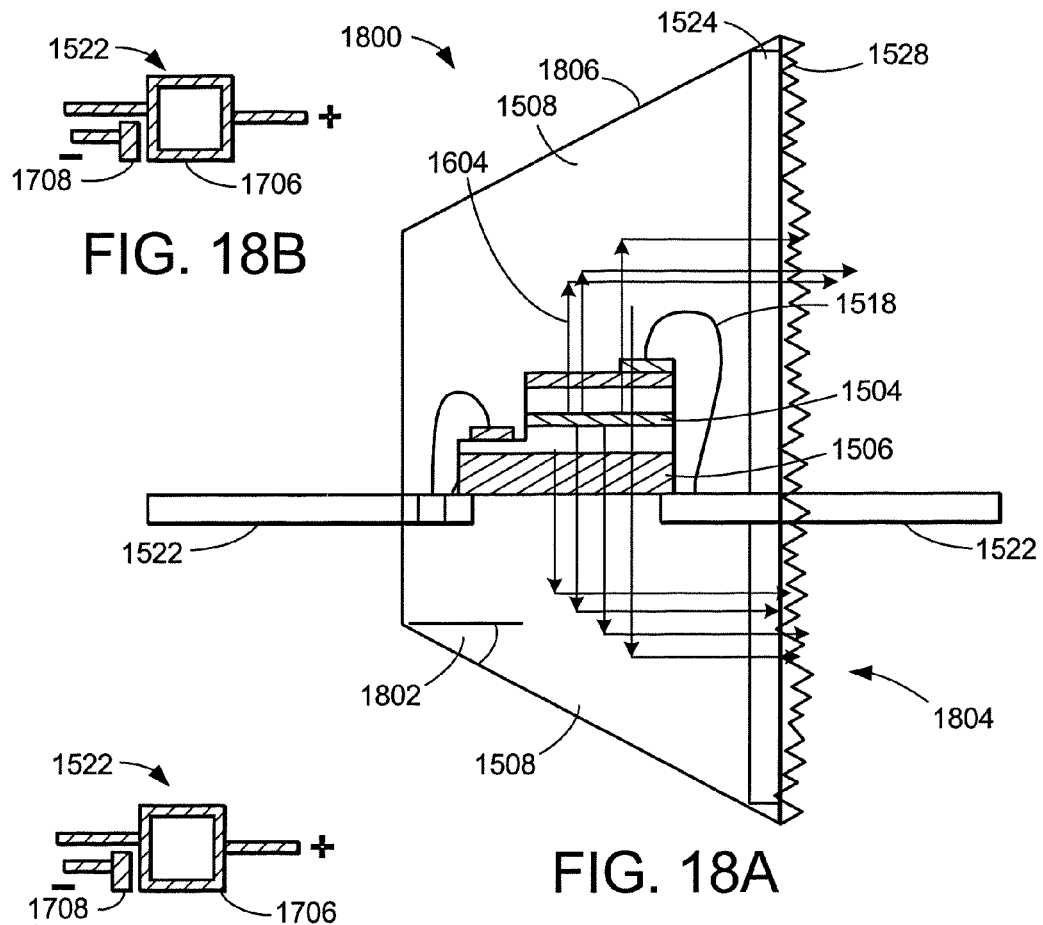
FIG. 18B
FIG. 18A
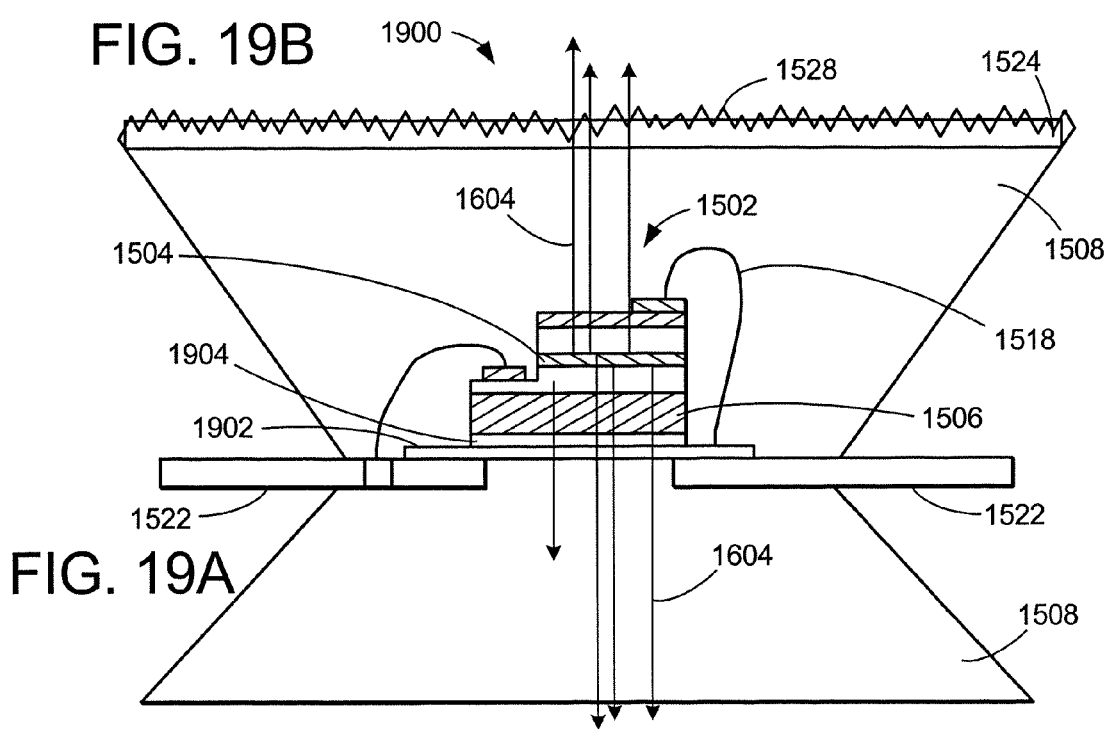
FIG. 19B
FIG. 19A

TEXTURED PHOSPHOR CONVERSION LAYER LIGHT EMITTING DIODE

CROSS-REFERENCE TO RELATED APPLICATIONS

This application is related to the following commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," now U.S. Pat. No. 7,704,763, issued Apr. 27, 2010, which application claims the benefit under 35 U.S.C Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING;"

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE," now U.S. Pat. No. 8,227,820 issued Jul. 24, 2012;

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS," now U.S. Pat. No. 7,344,958, issued Mar. 18, 2008, which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS;"

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERITCAL EMITTING, BEAM SHAPED, DISTRIBUTED FEEDBACK (DFB) LASERS BY GROWTH OVER A PATTERNED SUBSTRATE;" now U.S. Pat. No. 7,345,298, issued Mar. 18, 2008;

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,755,096, issued Jul. 13, 2010, which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE;"

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR," now U.S. Pat. No. 7,582,910, issued Sep. 1, 2009; U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS," which application claims the benefit under 35U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS;"

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS," now U.S. Pat. No. 7,795,146, issued Sep. 14, 2010, which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS;"

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," now U.S. Pat. No. 7,719,020, issued May 18, 2010, which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD;"

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES," now U.S. Pat. No. 7,768,023, issued Aug. 3, 2010;

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," now U.S. Pat. No. 7,768,024, issued Aug. 3, 2010, which application claims the benefit under 35 U.S.C Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH;"

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," now U.S. Pat. No. 7,994,527, issued Aug. 9, 2011, which application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED);"

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," now U.S. Pat. No. 7,956,371, issued Jun. 7, 2011, which application claims the benefit under 35 U.S.C Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED)," and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED);"

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES," now U.S. Pat. No. 7,858,996, issued Dec. 28, 2010, which application claims the benefit under 35 U.S.C Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES;"

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," which application claims the benefit under 35 U.S.C Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS;"

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES," which application claims the benefit under 35 U.S.C Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES;"

U.S. Utility patent application Ser. No. 11/940,866, filed on same date herewith, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS," now U.S. Pat. No. 7,977,694, issued Jul. 12, 2011, which application claims the benefit under 35 U.S.C Section 119(e) of U.S. Provisional Patent Application Ser. No. 60/866,015, filed on same date herewith, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS;"

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING," which application claims the benefit under 35 U.S.C Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING;"

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED," which application claims the benefit under 35 U.S.C Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED;"

U.S. Utility patent application Ser. No. 11/940,883, filed on Nov. 15, 2007, by Shuji Nakamura and Steven P. DenBaars, entitled "STANDING TRANSPARENT MIRRORLESS (STML) LIGHT EMITTING DIODE," now U.S. Pat. No. 7,687,813, issued Mar. 30, 2010, which application claims the benefit under 35 U.S.C Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE;" and U.S. Utility patent application Ser. No. 11/940,898, filed on Nov. 15, 2007, by Steven P. DenBaars, Shuji Nakamura and James S. Speck, entitled "TRANSPARENT MIRRORLESS (TML) LIGHT EMITTING DIODE," now U.S. Pat. No. 7,781,789, issued Aug. 24, 2010, which application claims the benefit under 35 U.S.C Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE."

all of which applications are incorporated by reference herein.

This application claims the benefit under 35 U.S.C. Section 119(e) of commonly-assigned U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE;" which application is incorporated by reference herein.

BACKGROUND OF THE INVENTION

1. Field of the Invention

This invention is related to LED Light Extraction and white LED with high luminous efficacy for optoelectronic applications, and, more specifically, relates to a textured phosphor conversion layer LED.

2. Description of the Related Art (Note: This application references a number of different publications as indicated throughout the specification. A list of these different publications can be found below in the section entitled "References." Each of these publications is incorporated by reference herein.)

In conventional white LEDs, the phosphor conversion layer is typically placed directly on top of the blue GaN chip. The surface is usually smooth and conformal to the surface of the GaN chip. The blue photons from the GaN chip are down converted into photons of lower energy (Yellow, Green, and Red) in the phosphor conversion layer. A large fraction of these photons are internal reflected in the phosphor conversion layer and directed back toward the chip where they are reabsorbed. This results in a decrease in overall luminous efficiency.

Previous applications of the phosphor conversion layer are limited to placing a gel or other liquid form of material onto the chip, and allowing the phosphor to cure. This non-uniform and typically smooth application of the phosphor does not take into account several factors that can be used to increase the efficiency of the LED.

SUMMARY OF THE INVENTION

The present invention describes an (Al, Ga, In)N and light emitting diode (LED) combined with a textured, or shaped, phosphor conversion in which the multi directions of light can be extracted from the surfaces of the chip and phosphor layer before subsequently being extracted to air. The present invention combines the high light extraction efficiency LED chip with shaped (textured) phosphor layers to increase the total luminous efficacy of the device. As a result, this combined structure extracts more light out of the white LED.

The present invention minimizes the internal reflection of the phosphor layer by preferential patterning the emitting surface to direct more light away from the absorbing chip structure. In order to minimize the internal reflection of the LED light further, transparent electrode such as Indium Tin Oxide (ITO) or Zinc Oxide (ZnO), or the surface roughening of AlInGaN by patterning or anisotropically etching, or the roughening of ITO and ZnO, or the roughening of epoxy and glass or the roughening of the phosphor layer, are used. The present invention furthermore combines the high light extraction efficiency LED chip with shaped (textured) phosphor layers to increase the total luminous efficacy of the device. As a result, this combined structure extracts more light out of the LED.

More particularly the invention relates to (Al, Ga, In)N LEDs and light extraction structure combined with phosphors and optimized optics for highly efficient (Al, Ga, In)N based light emitting diodes applications, and its fabrication method. Present invention describes a white high efficient LED created by maximizing extraction from the photon conversion layer. In the present invention it has been shown that roughening the surface of a phosphor layer increases the luminous efficacy of a white LED. In order to roughen the phosphor layer the phosphor is first prepared in a resin mixture. It is then poured directly onto an aluminum oxide 120-grit square piece of sandpaper (120 abrasive particles per inch). The optic used for the remote phosphor layer is then placed on top of the phosphor. This serves to flatten the phosphor on the sandpaper so that a thin uniform layer is produced. These items are then heated under the curing conditions for the resin.

A further extension is the general combination of a shaped high refractive index light extraction material with transparent conducting electrodes, textured phosphor conversion layers and shaped optical elements. The overall effect is to achieve a device with superior luminous efficacy and a high output power.

A Light Emitting Diode (LED) in accordance with the present invention comprises an LED chip, emitting light at a first wavelength region, an encapsulation layer, coupled to the LED chip, wherein the encapsulation layer is transparent at the first wavelength region, and a phosphor layer, coupled to the encapsulation layer and distant from the LED chip, the phosphor layer converting the light emitted by the LED chip in the first wavelength region to light in at least a second wavelength region, wherein at least a portion of a surface of the phosphor layer is textured.

Such an LED further optionally comprises the LED being made from a material selected from the group comprising (Al, Ga, In)N material system, the (Al, Ga, In)As material system, the (Al, Ga, In)P material system, the (Al, Ga, In) AsPNSb material system, and the ZnGeN2 and ZnSnGeN2 material systems, the textured phosphor layer having a cone shape, the encapsulation layer comprising epoxy, glass, air, and other materials that are transparent at the emission wavelength, at least a portion of a second surface of the phosphor layer being textured, the transparent electrode comprising a material selected from a group comprising ITO, ZnO, and a thin metal, the LED chip further comprising a current spreading layer, a textured sapphire substrate being used for the LED chip to increase the light transmission from the LED chip, a backside of the textured sapphire substrate being textured, the LED being molded into an inverted cone shape, light being extracted from the LED in a direction normal to the emitting surface of the LED chip, a mirror, and the mirror being designed such that light striking the mirror is reflected away from the LED chip.

Another LED in accordance with the present invention comprises an LED chip, emitting light at a first wavelength region and having a first refractive index, an encapsulation layer, coupled to the LED chip, wherein the encapsulation layer is transparent at the first wavelength region and having a second refractive index less than the first refractive index, wherein the second refractive index is greater than 1, and a phosphor layer, coupled to the encapsulation layer and distant from the LED chip, the phosphor layer converting light emitted in the first wavelength region to light in at least a second wavelength region, wherein at least a portion of a surface of the phosphor layer farthest from the LED chip is not normal to the light emitted from the LED chip.

Such an LED further optionally comprises the LED being made from a material selected from the group comprising (Al, Ga, In)N material system, the (Al, Ga, In)As material system, the (Al, Ga, In)P material system, the (Al, Ga, In) AsPNSb material system, and the ZnGeN2 and ZnSnGeN2 material systems, the phosphor layer having a cone shape, at least a portion of a second surface of the phosphor layer closer to the LED chip also being textured, the encapsulation layer comprising a material selected from a group comprising ITO, ZnO, and a thin metal, the LED chip further comprising a current spreading layer, and the encapsulation layer comprising epoxy, glass, and other materials that are transparent at the emission wavelength.

BRIEF DESCRIPTION OF THE DRAWINGS

Referring now to the drawings in which like reference numbers represent corresponding parts throughout:

FIGS. 7 and 8 illustrate the dual-sided roughened phosphor layer of the present invention placed inside of the epoxy molding;

FIGS. 9 and 10 illustrate an LED structure of the present invention using thick epoxy layers;

FIG. 16 illustrates an internal mirror in accordance with the present invention;

FIG. 17 illustrates a emission schema in a direction normal to the LED emissions in accordance with the present invention;

FIG. 18 illustrates an alternative embodiment of the emission schema shown in FIG. 17; and FIG. 19 illustrates another embodiment of the present invention.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Figure 1:
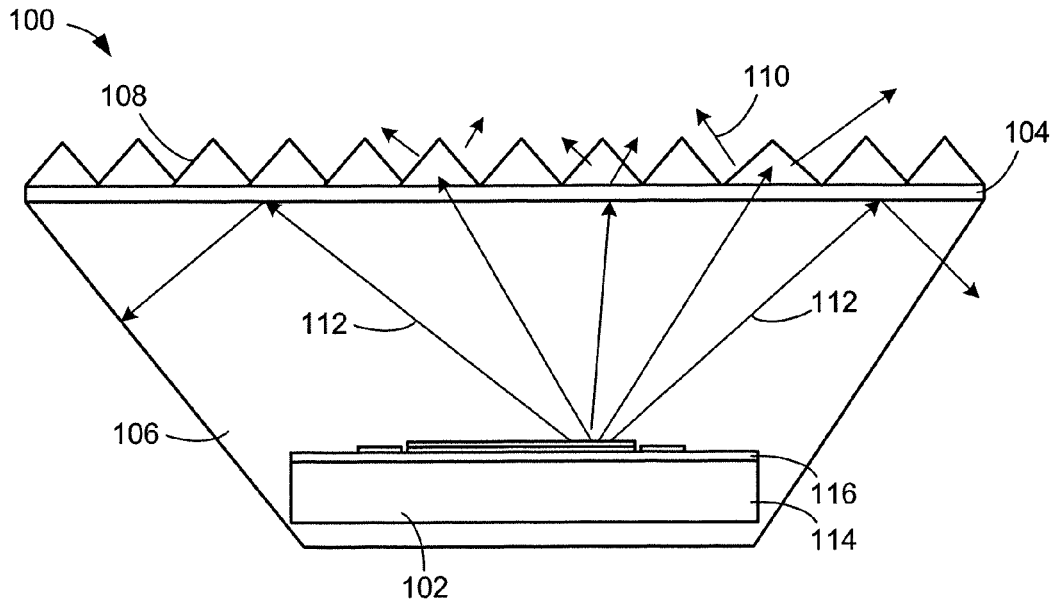
FIG. 1 illustrates the white LED structure of the present invention.
Figure 2:
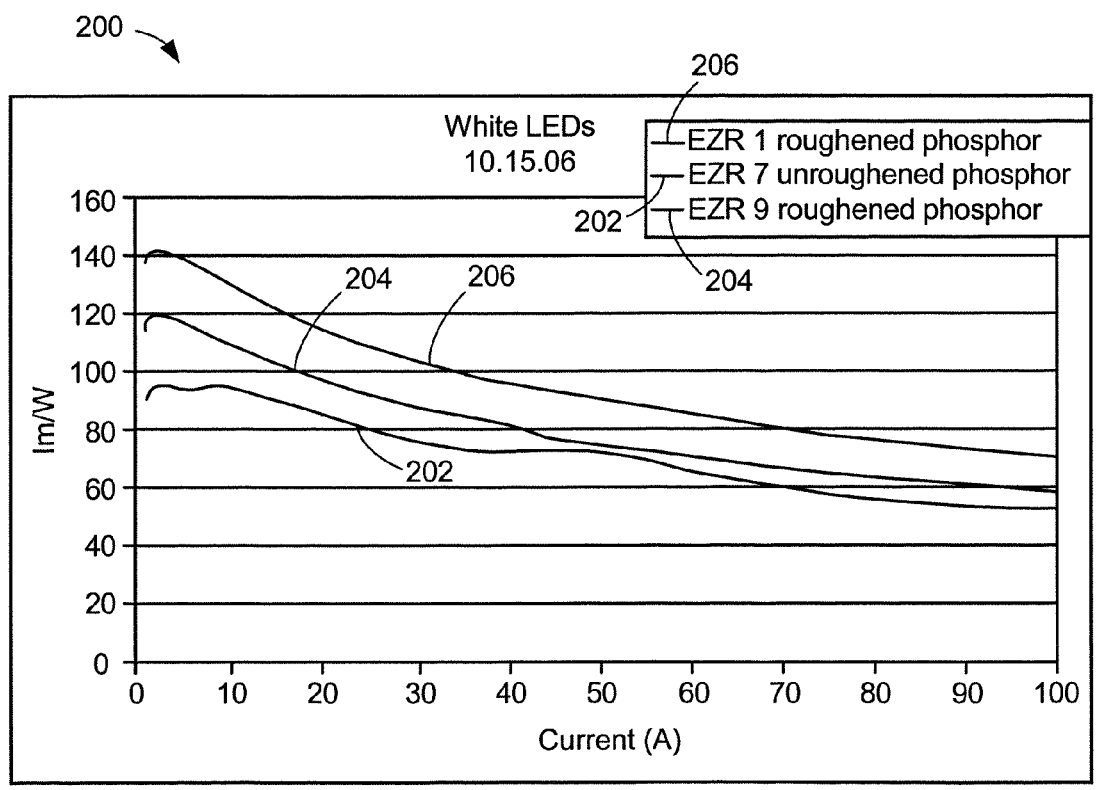
FIG. 2 illustrates the luminous efficacy of the white LEDs shown in FIG. 1.

The present invention describes the high efficient LEDs which use the phosphor to change the emission color of the LEDs. FIG. 1 shows the structure of the white LEDs which utilize the phosphor to get the white emission color. The phosphor layer is located near the surface of the inverted cone shape epoxy molding. When the surface of the phosphor layer is roughened, the luminous efficacy of the white LEDs is increased as shown in FIG. 2 in comparison with the white LEDs with a flat surface of the phosphor layer. The surface roughening improves the light extraction efficiency by reducing the reflection of the light at the interface between the phosphor layer and the air.

The present invention also includes an (Al, Ga, In)N and light emitting diode (LED) in which the multiple directions of light can be extracted from the surfaces of the chip before then entering the shaped plastic optical element and subsequently extracted to air after exciting the phosphor. In particular the (Al, Ga, In)N and transparent contact layers (ITO or ZnO) is combined with a shaped lens in which most light entering lens lies within the critical angle and is extracted. The present invention also includes a high efficient LED by minimizing the re-absorption of LED emission without any intentional mirrors attached to LED chip. The conventional LEDs have used a high reflective mirror in order to increase the front emission by reflecting the LED light forward direction. See FIGS. 1-3. However, this reflected emission is always partly re-absorbed by the emission layer or active layer of the LED. Then, the efficiency or the output power of LED was decreased. See FIGS. 1-3. The present invention reduces reflection from the phosphor layer, plastic encapsulant surface, reflection from the ITO or ZnO surface, reduces reflection from the GaN by roughening, patterning or anisotropically etched surface (microcones), and minimizes light re-absorption by the emitting layer (active layer) without any intentional mirrors attached to LED chip, enables uniform light emitting from active layer to both sides of front and back sides. The present invention furthermore combines the high light extraction efficiency LED chip with shaped (textured) phosphor layers to increase the total luminous efficacy of the device. As a result, this combined structure extracts more light out of the LED. See FIGS. 4-19.

DETAILED DESCRIPTION

In all of FIGS. 1-19, the details of the LED structure are not shown. Only the emitting layer (usually AlInGaN MQW), p-type GaN, n—GaN, sapphire substrate are shown. In the complete LED structure, there can be other layers such as p—AlGaN electron blocking layer, InGaN/GaN super lattices and others. Here, the most important parts are surface of the LED chip because the light extraction efficiency is determined mainly by the surface layer or condition of the epitaxial wafers. So, only some parts (the surface layers) of the LED chip are shown in all of the figures.

FIG. 1 illustrates a white LED structure of the present invention.

Light Emitting Diode (LED) 100 comprises LED chip 102 and a phosphor layer 104. The phosphor layer 104 is excited by the blue light from the LED chip 102 and converts the blue light, in the first wavelength region, to light in a second wavelength region. The phosphor layer is located near the surface of the inverted cone shape epoxy molding 106 to improve the conversion efficiency of the phosphor layer 104.

The surface 108 of the phosphor layer is roughened to increase the converted light extraction 110 from the phosphor layer 104. At least a portion of surface 108, rather than being completely planar, is roughened, textured, patterned, or otherwise made not normal to the light 112 emitted from the LED chip 102 so that reflection of light 112 is reduced. This irregular surface 108 may be generated through additional processing of phosphor layer 104, or may occur as the phosphor layer 104 is applied to LED 100, without departing from the scope of the present invention.

Although shown as a pyramid-like shape, the surface 108 can take any shape, so long as the shape of surface 108 reduces reflections of light 112 or increases the efficiency of conversion performed by phosphor layer 104. Some of the blue light 112 is reflected at the interface between the epoxy 106 and the phosphor layer 104 due to the flat surface of the back side of the phosphor layer 104.

LED chip 102 typically comprises a sapphire wafer 114 and a ITT-nitride LED active layer 116. The active layer 116 typically emits blue light 112, which excites phosphor layer 104 into producing yellow light 110. To increase the efficiency of LED 100, a zinc oxide (ZnO) layer 106 can be formed with a refractive index that is between that of the LED chip 102 and that of air, and for ZnO layer 106 the refractive index n is 2.1. Further, layer 106 can comprise ZnO, ITO, a thin metal, as well as an epoxy or some combination of these and other materials. Any material can be used for layer 106, so long as layer 106 is transmissive at the wavelengths being emitted by LED chip 102. The blue light 112 and the yellow emissions 110 both emit from LED 100 to form white light that emits from the surface 118 of LED 100.

FIG. 2 illustrates the luminous efficacy of the white LEDs of the present invention that are illustrated in FIG. 1.

Graph 200 shows a chart of current on the x-axis and lumens per watt on the y-axis. Line 202 shows an un-roughened phosphor layer 104, e.g., one with a flat upper surface rather than a roughened surface 108. As the surface 108 of the phosphor layer 104 is roughened, the luminous efficacy of the white LEDs is increased, as shown in graphs 204 and 206, due to the improvement of the light extraction efficiency from the phosphor layer 104.

Figure 3:
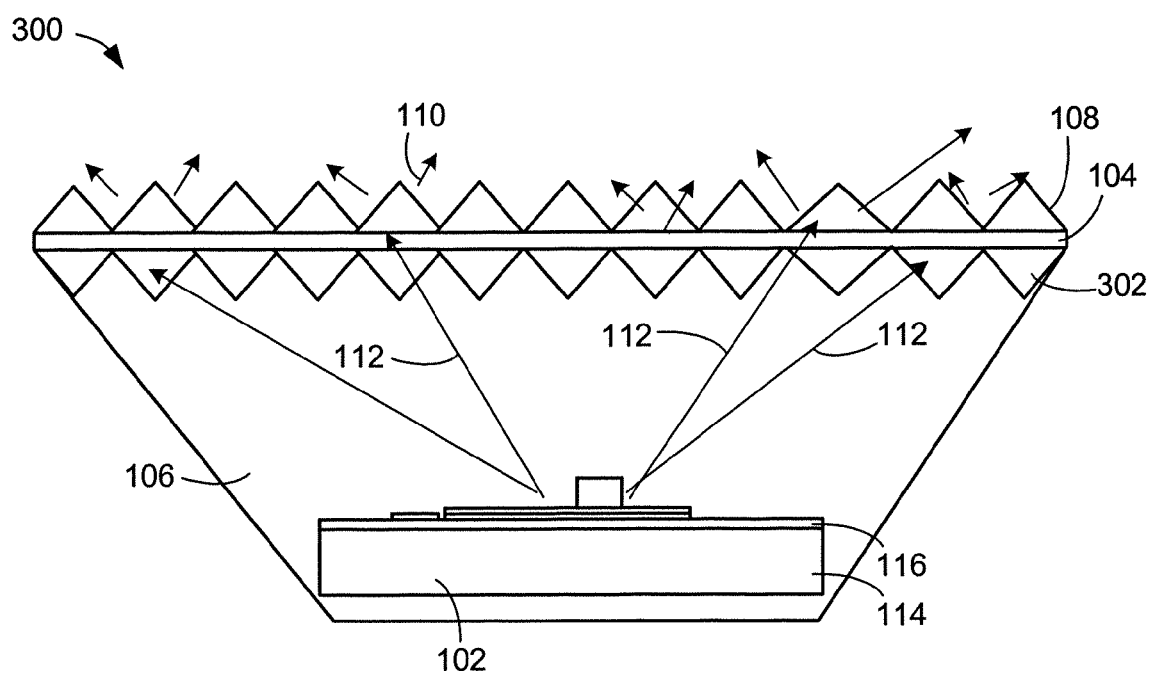
FIG. 3 illustrates the white LED structure of the present invention with a roughened phosphor layer on both sides of the interface between the epoxy and the phosphor.

FIG. 3 illustrates the white LED structure with a roughened phosphor layer on both sides of the interface between the epoxy and the phosphor layer.

As in FIG. 1, the upper surface 108 is roughened or textured, and now, in LED 300, at least a portion of the lower surface 302 of the phosphor layer 104 is also roughened or textured or otherwise made non-normal to the incident light 112. This allows for less reflection of blue light 112, and thus improves the efficiency of LED 300, because now the light 112 that was previously reflected is now emitted from the upper surface 108 of LED 300 or excites phosphor layer 104. The interface between the epoxy 106 and the phosphor layer 104, resulting in surface 302, is roughened to improve the conversion efficiency of the phosphor layer 104 by reducing the reflection of the blue light 112 that is shown in FIG. 1. The surface 302 can be created by texturing or roughening the surface of epoxy molding layer 106, or by using other methods to generate a textured or roughened surface 302. Further, the surface 302 may not be uniformly roughened or textured; the texture may take on different characteristics depending on where the LED chip 102 is located with respect to the surface 302.

Figure 4:
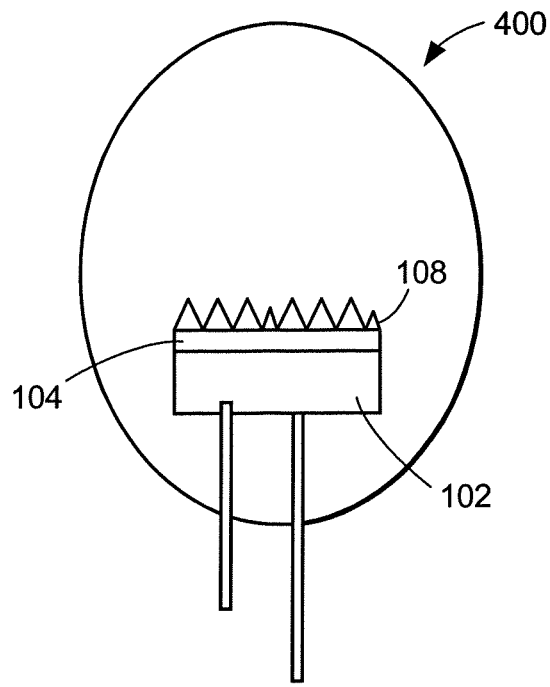
FIG. 4 illustrates the one side roughened phosphor layer of the present invention placed directly on the LED chip.

FIG. 4 illustrates the one side roughened phosphor layer of the present invention placed directly on the LED chip.

Rather than placing the phosphor layer 104 onto the epoxy layer 106, the phosphor layer 104 can be placed directly on LED chip 102, and have a patterned, textured, or roughened upper surface 108 as described previously, such that LED 400 will also have an increased efficiency. The approach shown in LED 400 also reduces reflection of blue light 112, and increases efficiency, because there is no reflecting surface between the emission of the LED chip 102 and the phosphor layer 104.

Figure 5:
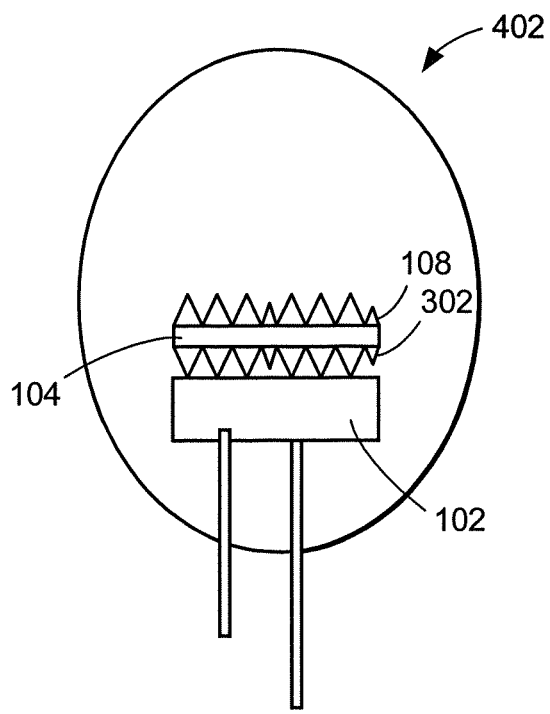
FIG. 5 illustrates the dual-sided roughened phosphor layer of the present invention placed directly on the LED chip.

FIG. 5 illustrates the dual-sided roughened phosphor layer of the present invention placed directly on the LED chip.

LED 402 shows that a dual-sided roughened phosphor layer 104, i.e., with surfaces 108 and 302, can also be placed directly on LED chip 102, to increase efficiency further.

Figure 6:
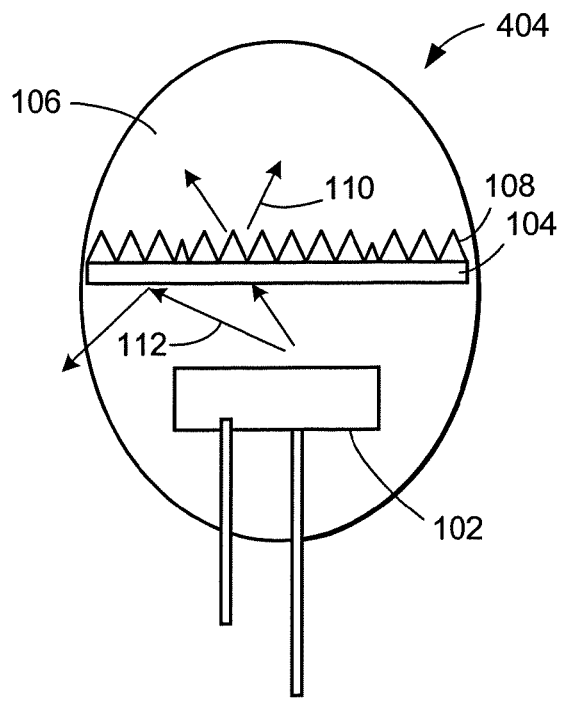
FIG. 6 illustrates the one side roughened phosphor layer of the present invention placed inside of the epoxy molding.

FIG. 6 illustrates the one side roughened phosphor layer of the present invention placed inside of the epoxy molding.

LED 404 uses a phosphor layer 104 inside of the epoxy layer 106, rather than on top of epoxy layer 106 as shown in FIGS. 1 and 3. This protects the phosphor layer 104 and upper surface 108 to allow for long-term high efficiency of LED 404.

Figure 7:
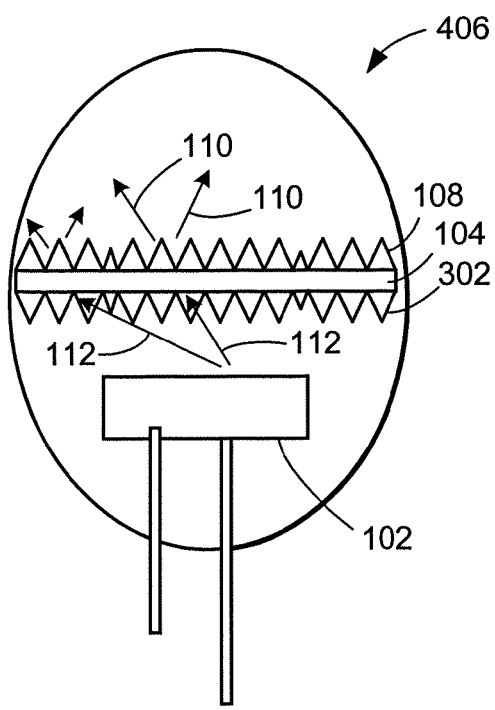

FIGS. 7 and 8 illustrate the dual-sided roughened phosphor layer of the present invention placed inside of the epoxy molding.

FIG. 7 shows LED 406 that has an internal phosphor layer 104, with textured or roughened surfaces 108 and 302.

FIGS. 8A and 8B illustrate an embodiment of the LED of the present invention.

LED 500 with emitted light 502 and active layer 504 are shown. Lead frame 506 and electrode 508 are shown as supporting glass plate 510.

In FIG. 8, the LED structure 500 is shown as being grown on a sapphire substrate. Then, Indium Tin Oxide (ITO) layer 512 is deposited on p-type GaN layer 514. Then, an ITO layer 516 is coated onto glass plate 510, and is attached to the deposited ITO layer 512 using epoxy as a glue. The other side 518 of glass plate 510 is roughened, patterned, or otherwise given a non-planar profile by a sand blast or other roughening technique, such as etching. Then, the sapphire substrate is removed using the laser de-bonding technique. Then, the Nitrogen-face (N face) GaN 520 is etched with wet etching such as KOH or HCL. Then, a cone-shaped surface 522 is formed on Nitrogen-face GaN 520. Then, LED chip 500 is put on a lead frame 506 which works for removing any heat that is generated by the LED chip 500. The wire bonding 524 and 526 is done between bonding pads of the LED chip 528 and 530 and a lead frame 506 and electrode 508 to allow an electric current to flow through the lead frame 506. There are no intentional mirrors at the front and back sides of LED chip 500. The lead frame 506 is designed to extract the light from the back side of the LED chip effectively as shown in the figure, because lead frame 506 acts as a support around the edges of LED chip 500, rather than supporting the entire underside of chip 500. As such, the LED light 532 is effectively extracted to both sides as emitted light 502. The ohmic contact below the bonding pad of n—GaN is not shown for simplicity. Then, the LED chip 500 is molded with a sphere shape molding 100 of plastic, epoxy, or glass, which acts as a lens to assist the emitted light 532 to escape from the LED and enter the air.

Figure 10:
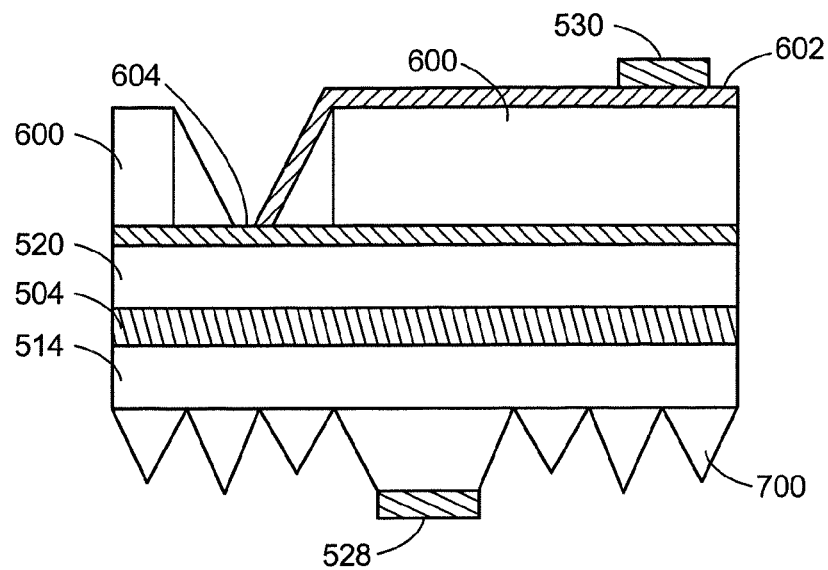

FIG. 9 illustrates additional details of an embodiment of the present invention, and FIG. 10 illustrates details of another embodiment of the present invention.

In FIGS. 9 and 10, instead of the glass layer 510 as shown in FIG. 5, a thick epoxy 600 is used. To make the electric contact, the epoxy 600 is partially removed, and ITO or a narrow stripe Au layer 602 is deposited on the epoxy 600 and the hole 604. The operation of the LED is similar to the LED described with respect to FIG. 8, except layer 514 is now roughened on the opposite side of active layer 504 to allow for additional light to be emitted from the reverse side of active layer 502.

In FIGS. 8-10, if a GaN substrate is used instead of a sapphire substrate, the laser de-bonding step is not required, and, as such, the glass and thick epoxy sub-mount are also not required. After the LED structure growth on GaN substrate, ITO is deposited on p-type GaN and the backside of GaN substrate (typically Nitrogen-face GaN) is etched with a wet etching such as KOH and HCL. Then a cone-shaped surface is formed on the Nitrogen face GaN. The remainder of the fabrication and operational steps are similar to the LED described with respect to FIG. 8.

Also, when the surface of ITO layers, e.g., layers 512, 516, etc., are roughened, the light extraction through the ITO layers 512, 516 is increased. Even without the ITO layer 512 that is deposited on the p-type GaN layer 514, the roughening of the surface of p-type GaN 514 as surface 700 is effective to increase the light extraction through the p-type GaN 514. To create an ohmic contact for n-type GaN layer 520, ITO or ZnO are typically used after the surface roughening of Nitrogen-face GaN layer 520. Since ITO and ZnO have a similar refractive index as GaN, the light reflection at the interface between ITO (ZnO) and GaN is minimized.

FIGS. 11-14 illustrates embodiments of a spherical LED in accordance with the present invention.

Figure 11B:
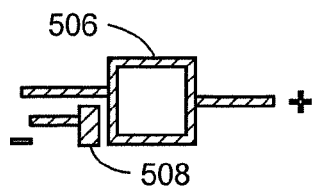
FIG. 11 illustrates a cross-sectional view of an LED of the present invention molded into a spherical shape.
Figure 11A:
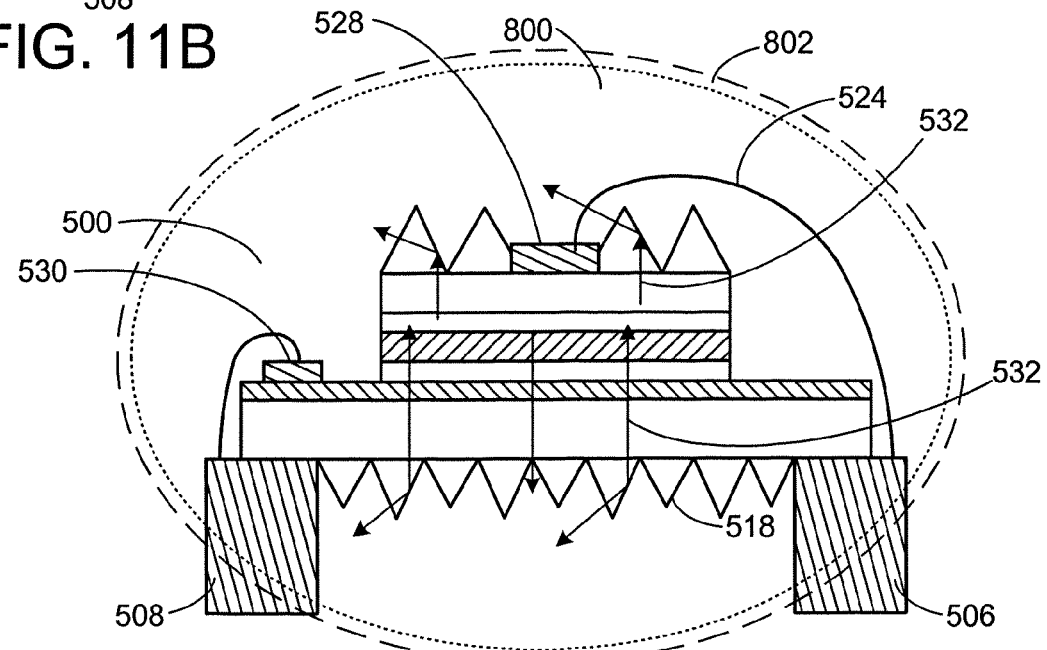

In FIG. 11A, the LED chip of FIG. 5 is molded with epoxy or glass 800 as a sphere shape. In this case, the light 532 is extracted to air through the sphere molding 800 effectively, because the LED chip 500 is a small spot light source compared to the diameter of the spherical lens 800. In addition, a phosphor layer 802 is placed or deposited near the outside surface of the lens molding 800. In this case, the conversion efficiency of the blue light to white light is increased due to a small re-absorption of the LED light 532 due to a small back scattering of the LED light 532 by the phosphor layer 802. Also, when the surface of the molding 800 or the phosphor layer 802 is roughened, the light extraction is increased from the molding 800 and/or the phosphor 802 to the air. FIG. 11B illustrates that chip 500 is mounted on frame 506 such that light 532 is also emitted from led 500 via surface 518 on the back side of chip 500.

Figure 12:
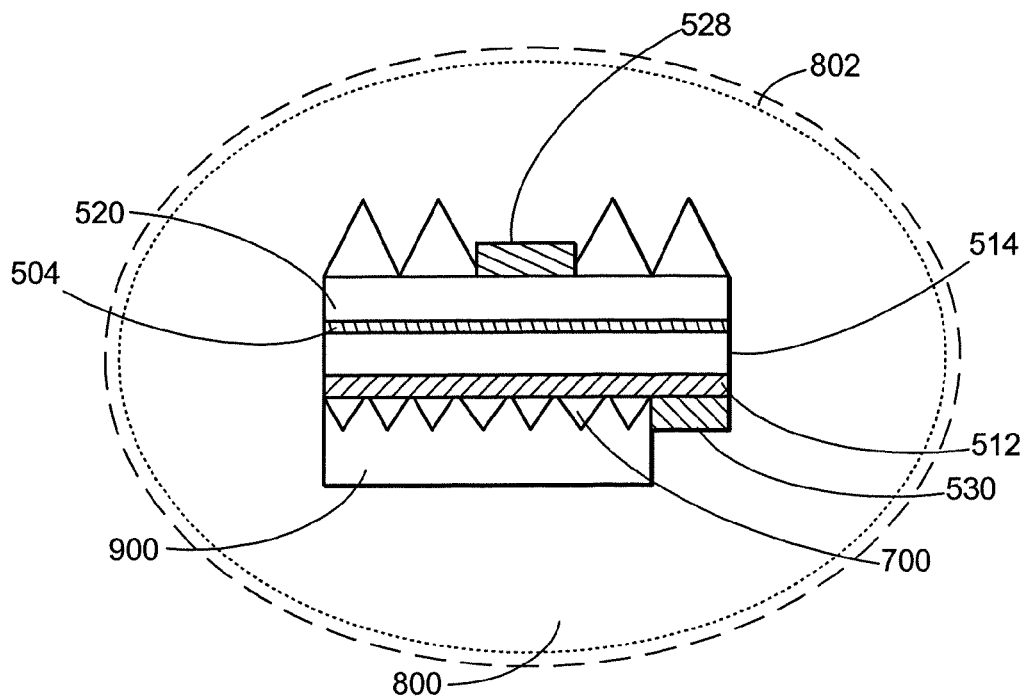
FIG. 12 illustrates the LED chip of the present invention with a roughened transparent oxide conductor layer.

In FIG. 12, in the LED chip of FIGS. 9-10, the ITO or ZnO is roughened as surface 700 to improve the light extraction through the ITO or ZnO. Then, the epoxy 900 is sub-mounted.

Figure 13B:
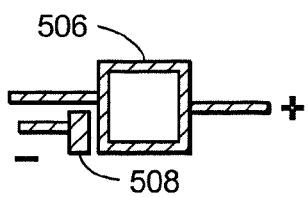
FIG. 13 illustrates a current spreading layer in accordance with the present invention.
Figure 13A:
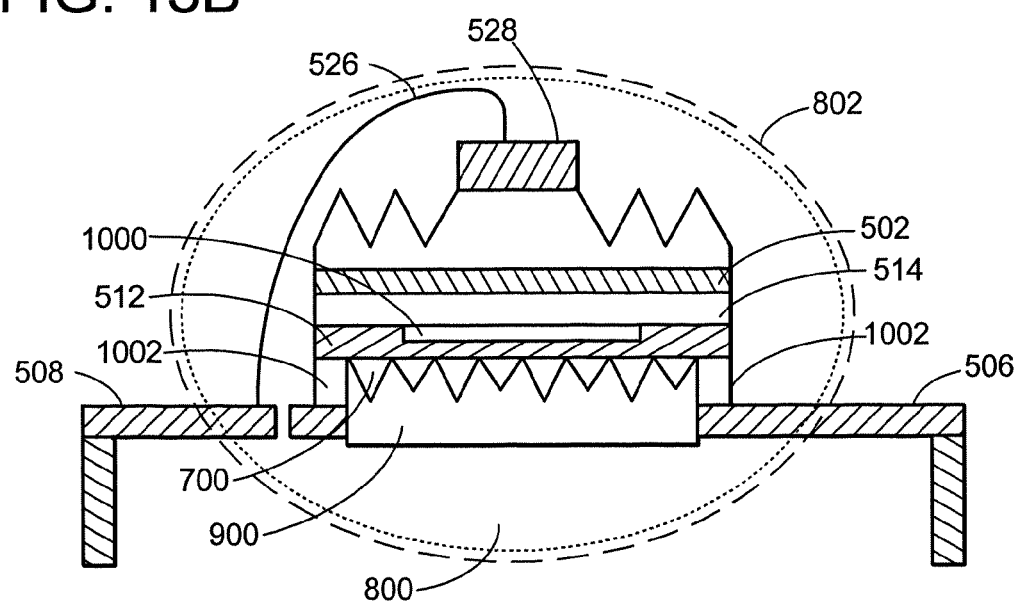

In FIG. 13, before the ITO or ZnO deposition, a current spreading layer ($SiO_2$, SiN, transparent insulating material) 1000 is deposited to allow a uniform current to flow through the p-type GaN layer 512, and contact 1002 is provided to contact frame 506.

Figure 14:
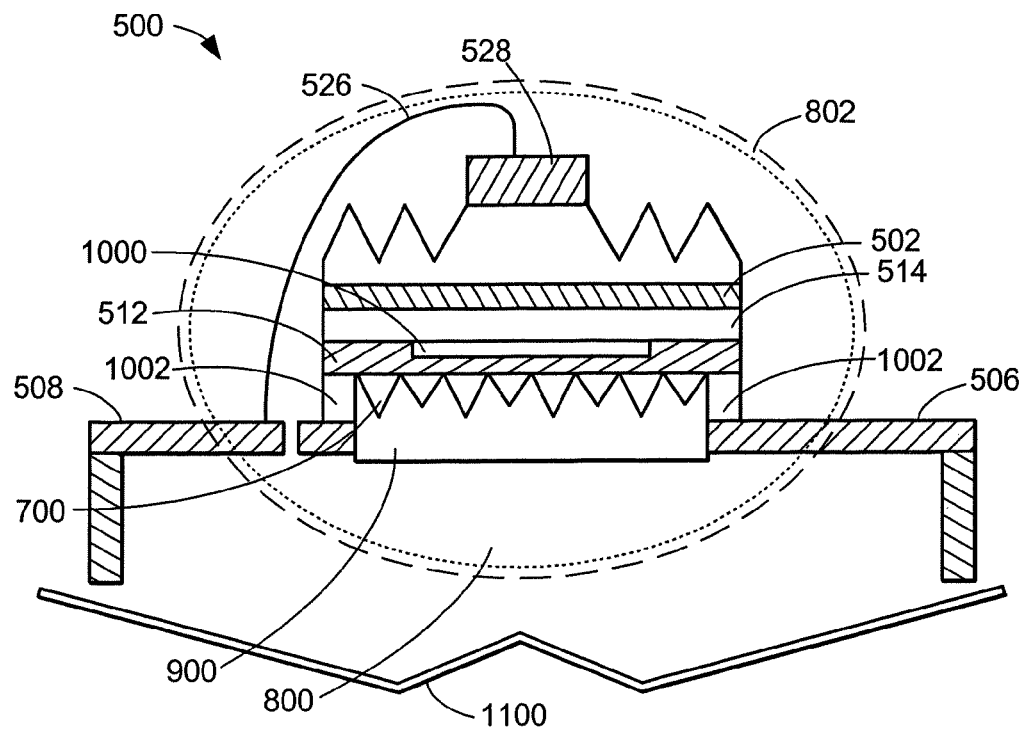
FIG. 14 illustrates a mirror placed outside of the spherical LED of the present invention.

In FIG. 14, a mirror 1100 is put outside of the sphere molding 800 in order to direct more light to a specific side of the LED package 500. The shape of the mirror 1100 is typically designed such that any reflected light is directed away from the LED chip 500 to avoid or minimize reabsorption of light by the active layer 502 of the LED chip 500.

Figure 15:
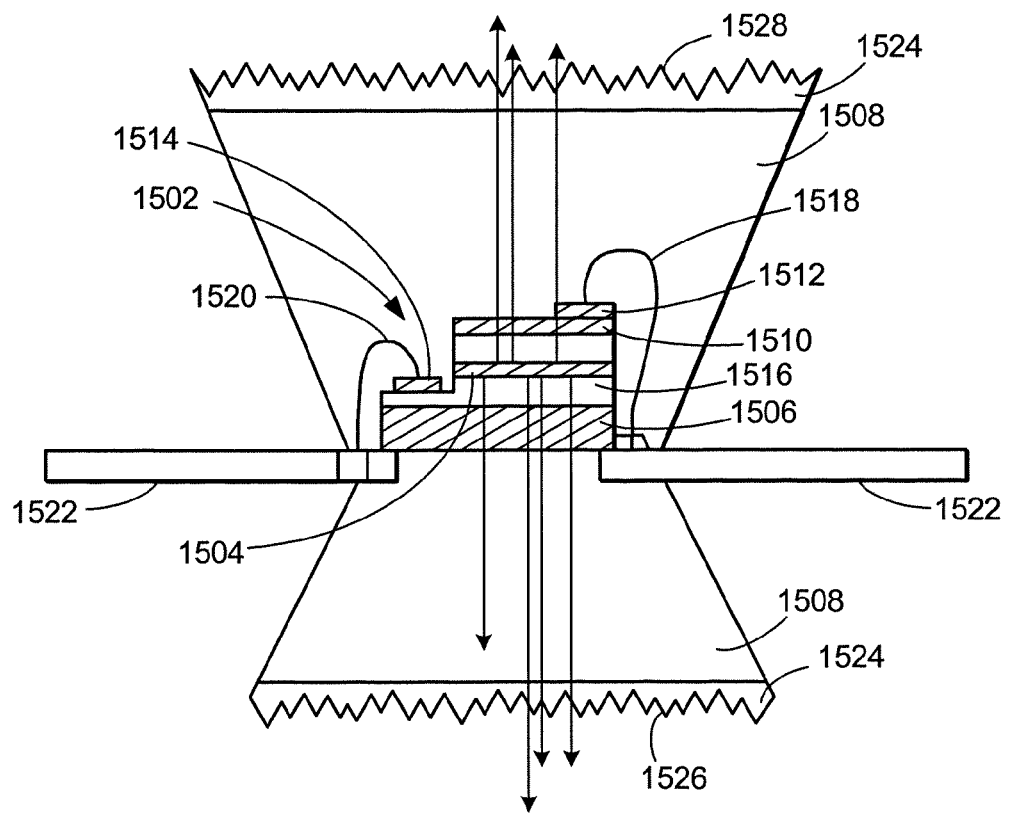
FIG. 15 illustrates another embodiment of the present invention.

FIG. 15 illustrates another embodiment of the present invention.

In FIG. 15, LED 1500 comprises an LED structure 1502 with an emitting layer 1504 that is grown on a flat sapphire substrate or a patterned sapphire substrate (PSS) 1506 to improve the light extraction efficiency through the interface between the LED structure 1502 and the sapphire substrate 1506. Also, the backside of the sapphire substrate 1506 is roughened to increase the light extraction from the sapphire substrate 1506 to the air or epoxy or glass 1508. A preferred shape of the roughened surface is typically a cone-shaped surface, but other surface topologies can be used without departing from the scope of the present invention.

Then an ITO or ZnO layer 1510 was deposited on p-type GaN. Then, bonding pad 1512 was formed on the ITO or ZnO layer 1510, and an Ohmic contact/bonding pad 1514 on n-type GaN layer 1516 are formed after disclosing the n-type GaN by a selective etching through p-type GaN. Wire bonds 1518 and 1520 are added to connect the LED structure 1502 to the lead frame 1522.

Then, the LED chip 1502 was molded as an inverted cone-shape for both the front and back sides by shaping epoxy/glass layers 1508 into inverted cone shapes. Then, the phosphor layers 1524 were put near the top surface of the glass/epoxy layers 1508 molding. Typically, this means that the phosphor layer is placed at a distance far away from the LED chip 1502. In this case, the conversion efficiency of the blue light to white light is increased due to a small re-absorption of the LED light due to a small back scattering by the phosphor to the LED chip. Then the surfaces 1526 and 1528 of the phosphor layers 1524 are roughened to improve the light extraction through the phosphor. The surfaces 1526 and 1528 may have different patterns or may be roughened in the same fashion as each other, as desired.

FIG. 16 illustrates an internal mirror in accordance with the present invention.

In FIG. 16, a mirror 1600 was put inside of the molding of epoxy/glass layer 1508 shown in FIG. 15 to increase the light output to a front side 1602 of LED chip 1502. The shape of the mirror 1600 was designed for the reflected light not to reach the LED chip 1502. If the reflected light can reach the LED chip 1502, the LED light 1604 would be re-absorbed by the LED chip 1502, which decreases the output power or the efficiency of the LED chip 1502, and thus the efficiency of the LED 1600 would also drop.

In this case, the mirror 1600 is partially attached to the LED chip 1502 or the substrate 1506. This partial attachment of the mirror 1600 is not defined as attached mirror to the LED chip 1502 because the mirror of a conventional LED chip is attached to the whole rear surface of the LED chip at the front or the back sides of the LED chip, which would allow for re-absorption of the light within the LED chip, which is undesirable.

Then, the phosphor layer 1524 was put near the top surface of the molding layer 1508. Again, this means that the phosphor layer 1524 should be put far away from the LED chip 1502 to allow the light to escape the LED chip 1502. In this case, the conversion efficiency of the blue light to white light is increased due to a small re-absorption of the LED light due to a small back scattering by the phosphor layer 1524. Then surface 1528 of the phosphor layer 1524 was roughened to improve the light extraction through the phosphor layer 1524.

FIGS. 17A and B illustrate an emission schema in a direction normal to the LED emissions in accordance with the present invention.

In FIG. 17, LED 1700 comprises mirrors 1702 and 1704 and molding 1508 are designed as shown. The LED light 1604 is obtained from the direction of the side wall, or normal to the top emitting surface of the LED chip 1502. Then, the phosphor layer 1524 was put near the top surface of the molding 1508. In this case, the conversion efficiency of the blue light to white light is increased due to a small re-absorption of the LED light 1604 due to a small back scattering by the phosphor layer 1524 to the LED chip. Then the surface 1528 of the phosphor layer 1524 is roughened to improve the conversion efficiency of the phosphor layer 1524 from blue light to yellow light. FIG. 17B shows lead frame 1522 with electrodes 1706 and 1708, which allow light to pass through electrode 1706 through substrate 1506 and contribute to the light emitting from LED 1700, increasing the efficiency of LED 1700. Although shown as two mirrors 1702 and 1704, these mirrors 1702 and 1704 can be a single mirror 1702 that is shaped as a conical or parabolic reflector to maximize the light emitting through surface 1528 if desired.

FIGS. 18A and 18B illustrate an alternative embodiment of the emission schema shown in FIG. 17.

In FIG. 18A, as in FIG. 17, LED 1800 has mirrors 1702 and 1704 inside of the molding 1508 removed. In this case, the shape of the molding 1508 is an inverted cone shape. The angle 1802 of the inverted cone is determined for all of the LED light 1604 to reflect to the front side 1804 of LED 1800.

For example, the typical refractive index of epoxy is n=1.5. The refractive index of the air is n=1. In such a case, the critical angle of the reflection is $sin^{-1}(1/1.5)$. So, the angle of the inverted cone 1802 should be more than $sin^{-1}(1/1.5)$. Then the LED light 1604 is effectively extracted from the front surface 1804 of the inverted cone, which is approximately parallel to the side wall of the LED chip 1502. A mirror 1806 coating can be applied to the epoxy layer 1508 to increase the reflection of the rear surface of the epoxy layer 1508 if desired.

Then, the phosphor layer 1524 is put near the top surface of the inverted cone-shape molding 1508, which places the phosphor layer 1524 relatively far away from the LED chip 1502. In this case, the conversion efficiency of the blue light to white light is increased due to a small re-absorption of the LED light 1604 due to a small back scattering by the phosphor layer 1524 to the LED chip 1502. Then surface 1528 of the phosphor layer 1524 is roughened to improve the conversion efficiency of the phosphor layer 1524 from blue to yellow emission. The details of lead frame 1522 are shown in FIG. 17B.

FIGS. 19A and B illustrates another embodiment of the present invention.

In FIG. 19A, LED 1900 uses a lead frame 1522 where the LED chip 1502 is placed that also uses a transparent plate 1902 such as glass, quartz and other materials, which is attached to the lead frame using a transparent epoxy 1904 as a die-bonding material. The transparent glass plate is used to extract the LED light 1604 to the epoxy molding 1508 on the underside of LED 1900 effectively. The details of lead frame 1522 are shown in FIG. 19B. Other portions of LED 1900 are similar to those described with respect to FIGS. 16-18.

ADVANTAGES AND IMPROVEMENTS

With a roughening or texturing of the phosphor layer, the conversion efficiency of the phosphor layer is increased by increasing the light extraction from the phosphor layer and also by increasing the excitation efficiency of the phosphor layer.

Also, without any intentional mirrors attached to LED chip (the mirror coated on lead frame is also included as the intentional mirrors), the re-absorption of LED light is minimized and the light extraction efficiency is increased dramatically. Then, the light output power of the LEDs is increased dramatically. See FIGS. 4-19.

The combination of a transparent oxide electrode with a surface roughened nitride LED and shaped lens results in high light extraction as shown in FIGS. 4-19.

REFERENCES

The following references are incorporated by reference herein:
1. Appl. Phys. Lett. 56, 737-39 (1990).
2. Appl. Phys. Lett. 64, 2839-41 (1994).
3. Appl. Phys. Lett. 81, 3152-54 (2002).
4. Jpn. J. Appl. Phys. 43, L1275-77 (2004).
5. Jpn. J. Appl. Physics, 45, No. 41, L1084-L1086 (2006).
6. Fujii T, Gao Y, Sharma R, Hu E L, DenBaars S P, Nakamura S. Increase in the extraction efficiency of GaN-based light-emitting diodes via surface roughening. Applied Physics Letters, vol. 84, no. 6, 9 Feb. 2004, pp. 855-7. Publisher: AIP, USA

CONCLUSION

In summary, the present invention comprises LEDs with high efficiency. A Light Emitting Diode (LED) in accordance with the present invention comprises an LED chip, emitting light at a first wavelength region, an encapsulation layer, coupled to the LED chip, wherein the encapsulation layer is transparent at the first wavelength region, and a phosphor layer, coupled to the encapsulation layer and distant from the LED chip, the phosphor layer converting the light emitted by the LED chip in the first wavelength region to light in at least a second wavelength region, wherein at least a portion of a surface of the phosphor layer is textured.

Such an LED further optionally comprises the LED being made from a material selected from the group comprising (Al, Ga, In)N material system, the (Al, Ga, In)As material system, the (Al, Ga, In)P material system, the (Al, Ga, In) AsPNSb material system, and the ZnGeN2 and ZnSnGeN2 material systems, the textured phosphor layer having a cone shape, the encapsulation layer comprising epoxy, glass, air, and other materials that are transparent at the emission wavelength, at least a portion of a second surface of the phosphor layer being textured, the encapsulation layer comprising a material selected from a group comprising ITO, ZnO, and a thin metal, the LED chip further comprising a current spreading layer, a textured sapphire substrate being used for the LED chip to increase the light transmission from the LED chip, a backside of the textured sapphire substrate being textured, the LED being molded into an inverted cone shape, light being extracted from the LED in a direction normal to the emitting surface of the LED chip, a mirror, and the mirror being designed such that light striking the mirror is reflected away from the LED chip.

Another LED in accordance with the present invention comprises an LED chip, emitting light at a first wavelength region and having a first refractive index, an encapsulation layer, coupled to the LED chip, wherein the encapsulation layer is transparent at the first wavelength region and having a second refractive index less than the first refractive index, wherein the second refractive index is greater than 1, and a phosphor layer, coupled to the encapsulation layer and distant from the LED chip, the phosphor layer converting light emitted in the first wavelength region to light in at least a second wavelength region, wherein at least a portion of a surface of the phosphor layer farthest from the LED chip is not normal to the light emitted from the LED chip.

Such an LED further optionally comprises the LED being made from a material selected from the group comprising (Al, Ga, In)N material system, the (Al, Ga, In)As material system, the (Al, Ga, In)P material system, the (Al, Ga, In) AsPNSb material system, and the ZnGeN2 and ZnSnGeN2 material systems, the phosphor layer having a cone shape, at least a portion of a second surface of the phosphor layer closer to the LED chip also being textured, the encapsulation layer comprising a material selected from a group comprising ITO, ZnO, and a thin metal, the LED chip further comprising a current spreading layer, and the encapsulation layer comprising epoxy, glass, and other materials that are transparent at the emission wavelength.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto and the full range of equivalents to the claims appended hereto.

What is claimed is:
1. A Light Emitting Diode (LED), comprising:
an LED chip, emitting light at a first wavelength region, wherein the LED chip is grown on a substrate or template and the light is emitted by the LED chip from both front and back sides of the LED chip;
a lead frame, to which the LED chip is attached, wherein the LED chip resides on a transparent plate in the lead frame that allows the light to be extracted out of the LED chip from both the front and back sides of the LED chip;

a molding which acts as a lens, formed on or around the LED chip and optically coupled to the LED chip, wherein the molding is transparent at the first wavelength region; and a phosphor layer, deposited on top of the molding distant from the LED chip and optically coupled to the molding, the phosphor layer converting the light emitted by the LED chip in the first wavelength region to light in at least a second wavelength region;

wherein at least a portion of a top surface of the phosphor layer is roughened, textured, or patterned, so that the portion of the top surface of the phosphor layer is not normal to the light emitted from the LED chip, to minimize internal reflection of the light within the phosphor layer, thereby increasing total luminous efficacy of the LED; and wherein a back side of the substrate or template, or the transparent plate upon which the LED chip resides, is roughened, textured or patterned, to increase light extraction from the back side of the LED chip through the transparent plate and through the lead frame.

2. The LED of claim 1, wherein the LED chip is made from a material selected from the group comprising a (Al, Ga, In)N material system, a (Al, Ga, In)As material system, a (Al, Ga, In)P material system, a (Al, Ga, In) AsPNSb material system, a $ZnGeN_2$ material system, and a $ZnSnGeN_2$ material system.

3. The LED of claim 1, wherein the molding comprises epoxy, glass, air, and other materials that are transparent at the emission wavelength.

4. The LED of claim 1, wherein at least a portion of a bottom surface of the phosphor layer is shaped.

5. The LED of claim 1, further comprising a transparent electrode on a surface of the LED chip, wherein the transparent electrode comprises a material selected from a group comprising ITO, ZnO, and a thin metal.

6. The LED of claim 5, the LED chip further comprising a current spreading layer.

7. The LED of claim 1, wherein the molding has an inverted cone shape.

8. The LED of claim 1, wherein light is extracted from the LED chip in a direction normal to the emitting surface of the LED chip.

9. The LED of claim 1, further comprising a mirror.

10. The LED of claim 9, wherein the mirror is designed such that light striking the mirror is reflected away from the LED chip.

11. A Light Emitting Diode (LED), comprising:

an LED chip, emitting light at a first wavelength region and having a first refractive index, wherein the LED chip is grown on a substrate or template and the light is emitted by the LED chip from both front and back sides of the LED chip;

a lead frame, to which the LED chip is attached, wherein the LED chip resides on a transparent plate in the lead frame that allows the light to be extracted out of the LED chip from both the front and back sides of the LED chip;

a molding which acts as a lens, formed on or around the LED chip and optically coupled to the LED chip, wherein the molding is transparent at the first wavelength region and has a second refractive index less than the first refractive index, wherein the second refractive index is greater than 1; and a phosphor layer, deposited on top of the molding distant from the LED chip and optically coupled to the molding, the phosphor layer converting light emitted in the first wavelength region to light in at least a second wavelength region;

wherein at least a portion of a top surface of the phosphor layer is roughened, textured, or patterned, so that the portion of the top surface of the phosphor layer is not normal to the light emitted from the LED chip, to minimize internal reflection of the light within the phosphor layer, thereby increasing total luminous efficacy of the LED; and wherein a back side of the substrate or template, or the transparent plate upon which the LED chip resides, is roughened, textured or patterned, to increase light extraction from the back side of the LED chip through the transparent plate and through the lead frame.

12. The LED of claim 11, wherein the LED chip is made from a material selected from the group comprising a (Al, Ga, In)N material system, a (Al, Ga, In)As material system, a (Al, Ga, In)P material system, a (Al, Ga, In) AsPNSb material system, a ZnGeN2 material system, and a ZnSnGeN2 material system.

13. The LED of claim 11, wherein at least a portion of a bottom surface of the phosphor layer, the second surface being closer to the LED chip, is also shaped.

14. The LED of claim 11, further comprising a transparent electrode on a surface of the LED chip, wherein the transparent electrode comprises a material selected from a group comprising ITO, ZnO, and a thin metal.

15. The LED of claim 14, the LED chip further comprising a current spreading layer.

16. The LED of claim 11, wherein the molding comprises epoxy, glass, and other materials that are transparent at the emission wavelength.

* * * * *